United States Patent [19]

Tessier et al.

[11] Patent Number: 5,789,815
[45] Date of Patent: Aug. 4, 1998

[54] THREE DIMENSIONAL SEMICONDUCTOR PACKAGE HAVING FLEXIBLE APPENDAGES

[75] Inventors: Theodore G. Tessier, Chandler; John W. Stafford; David A. Jandzinski, both of Phoenix, all of Ariz.

[73] Assignee: Motorola, Inc., Schaumburg, Ill.

[21] Appl. No.: 636,483

[22] Filed: Apr. 23, 1996

[51] Int. Cl.⁶ .......................... H01L 23/495; H01L 23/34; H01L 23/02

[52] U.S. Cl. .......................... 257/723; 257/668; 257/678; 361/749; 361/784; 361/792; 361/790

[58] Field of Search .................. 257/668, 723; 361/784, 792, 790, 749

[56] References Cited

U.S. PATENT DOCUMENTS

| | | |
|---|---|---|
| 5,072,283 | 12/1991 | Bolger . |
| 5,220,198 | 6/1993 | Tsui .......................... 257/723 |
| 5,224,023 | 6/1993 | Smith et al. .............. 361/412 |
| 5,285,107 | 2/1994 | Kazami et al. .......... 257/723 |
| 5,363,275 | 11/1994 | Frankeny et al. ....... 361/749 |
| 5,382,829 | 1/1995 | Inoue ........................ 257/668 |
| 5,406,027 | 4/1995 | Matsumoto et al. ... 174/52.2 |
| 5,448,511 | 9/1995 | Paurus et al. ........... 257/686 |

Primary Examiner—Jerome Jackson
Assistant Examiner—Teresa M. Arroyo
Attorney, Agent, or Firm—Kevin B. Jackson; Rennie William Dover; Robert D. Atkins

[57] ABSTRACT

A three dimensional packaging approach reduces the overall footprint for interconnecting multiple semiconductor die. An three-dimensional folded module (10) produces a final package having a footprint size reduced by an approximate factor of four when compared to conventional electronic packaging. The module has a protective covering such as a cap (62) or a sealant (64) as a moisture barrier. Thus, high integration using flexible appendages (15, 25, 35, and 45) attached to a rigid substrate (12) and singularly folded above the substrate (12) results in both a small footprint package and also a light package. A reel-to-reel flex tape (56) assembly provides pre-tested flex boards (16, 26, 36, and 46) resulting in a cost-effective manufacturable package for semiconductor components.

15 Claims, 3 Drawing Sheets

5,789,815

1

THREE DIMENSIONAL SEMICONDUCTOR PACKAGE HAVING FLEXIBLE APPENDAGES

BACKGROUND OF THE INVENTION

The present invention relates, in general, to integrated circuit devices and, more particularly, to the packaging of electronic components.

Semiconductor dice are typically coupled to metal lead frames and then encapsulated in transfer molded plastic packages. Packaging schemes for electronic components have become bulky in providing routing channels for the high number of combined trace lines of Input and Output (I/O) signals and power supply lines that must be routed from the dice perimeter to the package pins.

Semiconductor manufactures have developed several packaging schemes that address the trace line routing issue while achieving a smaller package footprint compared to conventional transfer molded packages. One such example is the Pin Grid Array (PGA) package. A PGA package has an array of pins across a surface of a package body instead of along a perimeter of a conventional package.

Another example is the Ball Grid Array (BGA) which is typically smaller than the PGA package. The BGA package contains an assembly substrate with an array of holes that are plated or otherwise filled with a metal. The array of plated holes couple metal traces located on one side of the assembly substrate to an array of solder balls located on an opposite side of the assembly substrate. The semiconductor die is coupled to the metal traces on the assembly substrate, and the array of solder balls is coupled to a circuit board. BGA packages reduce the size of a packaged electronic component.

Low Temperature Co-Fired Ceramic (LTCC) technology, Mass Memory Board (MMB), Multi-Chip Modules (MCM), and the Matsushita high density memory module are concepts providing multiple semiconductor dice as subassemblies into a small footprint area. The above packaging concepts suffer from complex assembly procedures, critical material flatness criteria, layer-to-layer alignment requirements, and burn-in and test difficulties.

Accordingly, a need exists for interconnecting and packaging multiple electronic components that reduces the final size of conventional electronic component packaging. A method for reducing the footprint of packaged dice should be cost-effective and manufacturable.

DETAILED DESCRIPTION OF THE DRAWINGS

Figure 1:
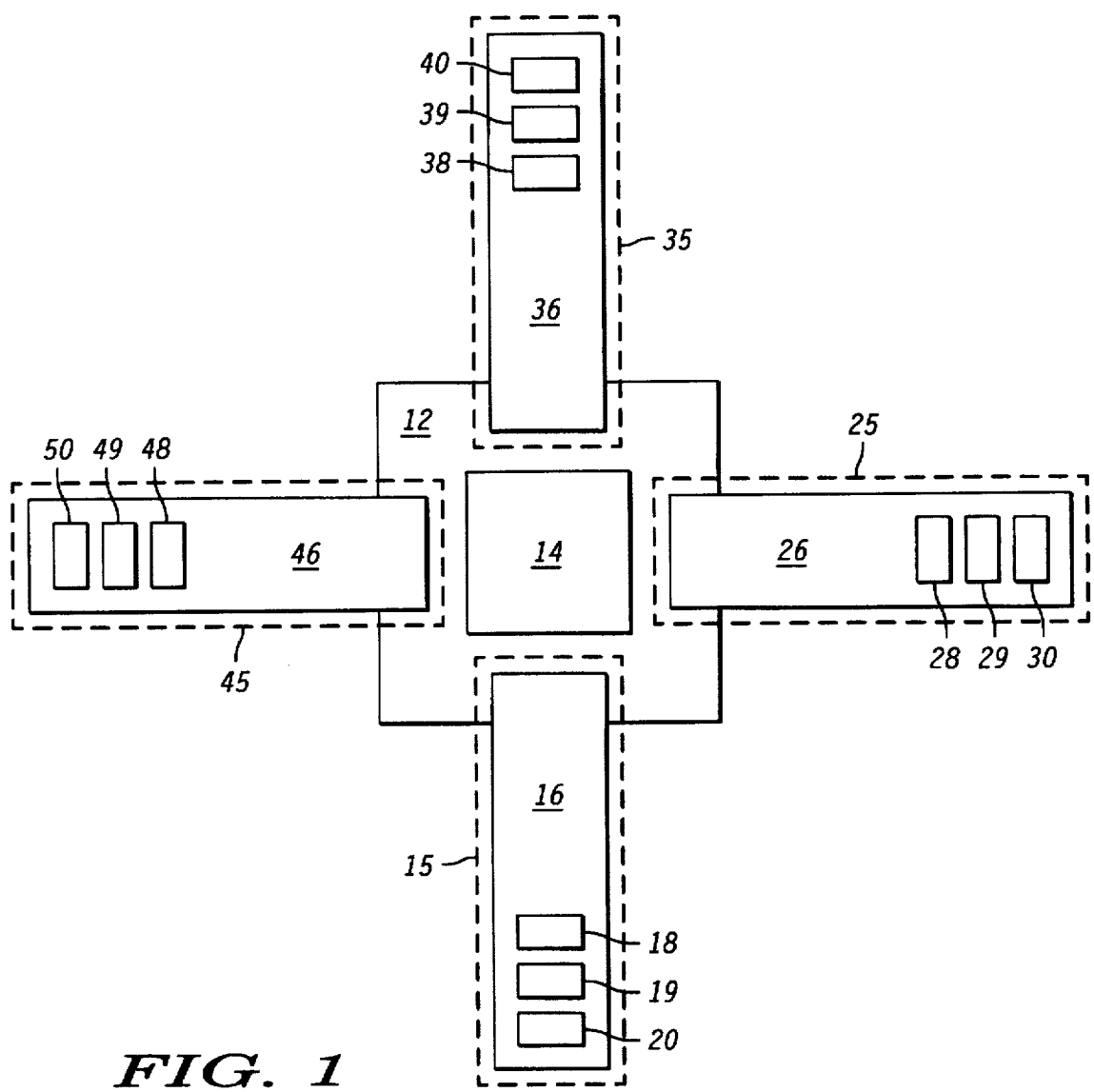
FIG. 1 illustrates assembled components for packaging a plurality of semiconductor die in accordance with a preferred embodiment of the present invention.

Turning to the figures for a more detailed description, FIG. 1 outlines an embodiment of assembled components for packaging a plurality of semiconductor die in accordance with the present invention. Folded module 10 is a three dimensional semiconductor package having a first semiconductor device, such as a Complementary Metal Oxide Semiconductor (CMOS) microprocessor 14 connected to a first major surface of a support substrate 12. Substrate 12 forms the central structure or board for supporting flexible appendages. Subassembly 15, comprising semiconductor die 18, 19, and 20 and flex board 16, is a first flexible appendage connected to substrate 12. Semiconductor die, such as 18, 19, and 20 connected to the flex boards could be Fast Static Random Access Memory (FSRAM), Dynamic Random Access Memory (DRAM), Application Specific Integrated Circuits (ASIC), or other semiconductor devices. Likewise, subassembly 25, comprising semiconductor die 28, 29, and 30 and flex board 26, is a second flexible appendage connected to substrate 12. Subassembly 35, comprising semiconductor die 38, 39, and 40 and flex board 36, is a third flexible appendage connected to substrate 12. Subassembly 45, comprising semiconductor die 48, 49, and 50 and flex board 46, is a fourth flexible appendage connected to substrate 12. Flexible appendages 15, 25, 35, and 45 are shaped having a first major side and a second major side and a first end for coupling to substrate 12 and a second end.

Rectangular shaped support substrate 12 has four edges on the first major surface and provides a perimeter surface area for attaching the four flexible appendages 15, 25, 35, and 45. For instance, flexible appendage 15 has a first end that connects at the first edge on the first major surface of substrate 12 and is attached such that the majority of flexible appendage 15 extends away from substrate 12. Likewise, flexible appendages 25, 35, and 45 are similarly connected to substrate 12. The rigidity of the central substrate 12 provides dimensional stability as attachments, such as flexible appendages 15, 25, 35, and 45 are added to the resultant package.

Flex board 16 provides an electrical interconnect for connecting signal and power supply lines between substrate 12, containing microprocessor 14, and a second semiconductor device, such as semiconductor die 18, 19, and 20, which are connected to flex board 16. Flex boards 16, 26, 36, and 46 include electrical interconnects between substrate 12 and semiconductor die connected to flex boards 16-46. A primary semiconductor die such as microprocessor 14 mounted on substrate 12 also includes electrical interconnect from microprocessor 14 to selected appendage attach sites.

In this embodiment the polyimide flex board material and substrate 12 are different materials with substrate 12 composed of aluminum oxide or aluminum nitride. In another embodiment, substrate 12 is a rigid Printed Wiring Board (PWB) made of multiple layers of epoxy glass laminate which satisfy the classification for the type of board known as FR-4. While specific embodiments of the present invention have been shown and described, further modifications and improvements will occur to those skilled in the art. For instance, other acceptable types of glass reinforced laminates having Glass Transition (Tg) temperatures in excess of 180° C. can be used to form substrate 12. It is understood that the invention is not limited to the particular materials described.

Figure 2:
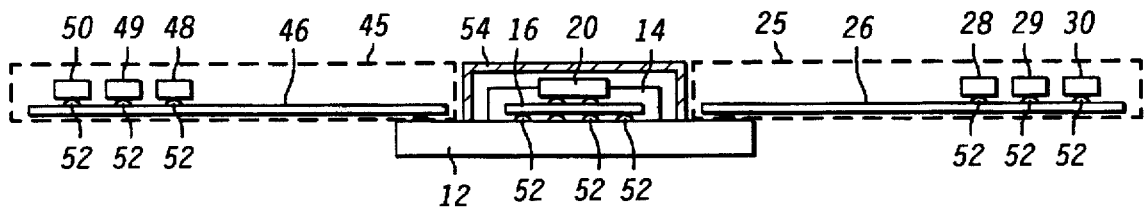
FIG. 2 illustrates a side view of the assembled components for packaging a plurality of semiconductor die in accordance with FIG. 1.

FIG. 2 illustrates a side view of the assembled components for packaging a plurality of semiconductor die in accordance with FIG. 1. Thermal cap 54 is shown as a cross-sectional view but fully surrounds the back-side of flip-chip microprocessor 14. Microprocessor 14 is attached to the base structure substrate 12 by a flip-chip method, such as Ball Grid Array (BGA). A mask applied to the top major surface of substrate 12 defines sites for an array of solder bumps 52, which are applied in preparation for attaching microprocessor 14 to substrate 12. Microprocessor 14 is arrayed with bumps, such as nickel-gold bumps or solder, on the top surface of the semiconductor die for mating with the array of solder bumps or solderable pads on substrate 12. A reflow solder process is then used to attach microprocessor 14 to substrate 12. Suppliers, such as NCI, Ibiden, Mommers Print Service, HADCO, and Zycon provide materials for the flip-chip technology.

Likewise, semiconductor die 18, 19 and 20 are attached to flex board 16 using a solder applied to sites on flex board 16. A 60:40 Sn/Pb solder is suitable. Preferably, a process with pre-bumped semiconductor die 18, 19 and 20 uses a high temperature solder process and a flip-chip attach technology while providing either a 95:5 Pb/Sn solder bump or an electroless Ni/Au bump. Other solder bumps, such as a 90:10 Pb/Sn solder bump can also be used. Preferably the bump height is approximately twenty-five to fifty micrometers. It is understood that the invention is not limited to the particular solder materials described.

Semiconductor die 18, 19, and 20 are then attached to flex board 16 by initially reflowing the low temperature solder above 220° C., dispensing a commercially available epoxy based underfill material with silica filler to encapsulate, and curing at a temperature below 180° C. Suitable encapsulants are available from Zymet, Hysol, Emerson Cummings, Ablestik, and Alpha Metals. The encapsulate process applies to both substrate 12 after attaching microprocessor 14 and to flex board 16 after attaching semiconductor die 18, 19 and 20. Alternately, the semiconductor die are connected to the PWB and the flex boards using wire bond edge connections when fewer signal lines and contacts are required.

Flexible appendages 15, 25, 35, and 45 attach to the central substrate 12 through either solder bumps 52 or electrical conductive adhesive dots (not shown). Solder bumps 52 preferably comprise an isotropic conductive material, such as a silver filled epoxy which is screen printed onto flex board 16. Flexible appendages 15, 25, 35, and 45 are then attached to substrate 12 using a reflow heat process. Alternately, thermoset isotropic adhesive dots placed on pads located on both substrate 12 and the flexible appendage surfaces provide "Z" axis connections between the flexible appendages and substrate 12. The thermally stable thermoset isotropic adhesive dots are selected to withstand the solder reflow process that attaches a BGA embodiment to the next level of packaging. Bonding conditions depend on the adhesive technology selected but would be below 200° C. and 5 Kg of pressure. Adhesive dot materials are commercially available from Hitachi Chemical, Three Bonds, Sony, Uniax and Minnesota Mining and Manufacturing (3M).

In the embodiment of FIG. 2, a thermal cap 54 covers the back-side of flip-chip microprocessor 14 and provides a thermally conductive path for directing heat away from microprocessor 14 for dissipation in substrate 12. Thermal grease (not shown) preferably is applied to the back-side of microprocessor 14 to improve the thermal conductivity for heat removal from the semiconductor die to thermal cap 54. Optionally solid copper thermal vias (not shown) located in the PWB structure are used to transfer heat from the front-side of microprocessor 14 for thermal dissipation into substrate 12.

Figure 3:
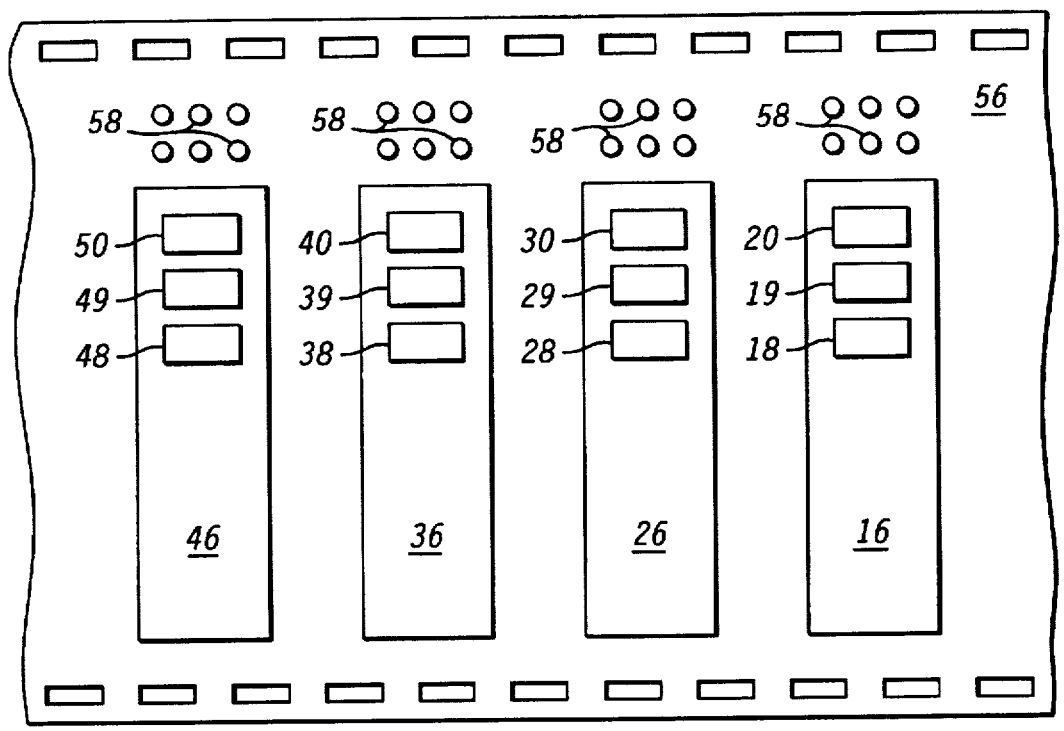
FIG. 3 illustrates the front side of a patterned flex tape used in a reel-to-reel assembly.

FIG. 3 illustrates the front side of a flexible or flex tape 56, which is used in a preferred reel-to-reel assembly. Tape widths of 35, 70 and 150 millimeters are available for use as flex tape 56. Patterned within flex tape 56 are flex boards 16, 26, 36, and 46. Flex tape 56 features automated reel-to-reel assembly with automated testing and burn-in. Automation procedures include placement of the semiconductor die onto the flex board of tape 56 for furnace solder reflow followed by encapsulation, or alternately, adhesive attachment of the die to the flex board in a thermal process followed by curing. Patterned copper foil interconnect lines from semiconductor die 18, 19, and 20 route to multiple pad test sites 58 for providing, for example, access to address and data bus lines when semiconductor die 18, 19, and 20 comprise memory devices. Thus, flexible appendages 15, 25, 35, and 45 imbedded in tape 56 are tested prior to being singulated as preparation for attaching to substrate 12. The reel-to-reel flex tape 56 assembly provides tested flex boards 16, 26, 36, and 46 resulting in fully tested, high yield appendages as components for a cost-effective manufacturable package for semiconductor components.

Reel-to-reel flexible tape 56 preferably comprises a polyimide film having a twenty-five to fifty micrometer thickness and a patterned copper foil attached providing an electrical interconnect for connecting signal lines. The copper conductive connective structure provides a plurality of conductive traces typically having 5 micrometers of nickel and 0.2 micrometers of gold surface finish. The copper foil is patterned such that the semiconductor die can be attached to one or both sides of flex boards 16, 26, 36, and 46 (die attachment to only one side of the flex board is illustrated in FIG. 2). The patterned copper foil (not shown) typically has line widths of approximately 50 micrometers and spacing of about 50 micrometers. Plated copper vias approximately 150 micrometers in diameter form through-hole connections for transferring electrical signals from one side to the other side of the flex board. The suppliers of flex tape 56 include Sheldahl, 3M, Simflex, MCTS, Shindo, and Fujikura.

Figure 4:
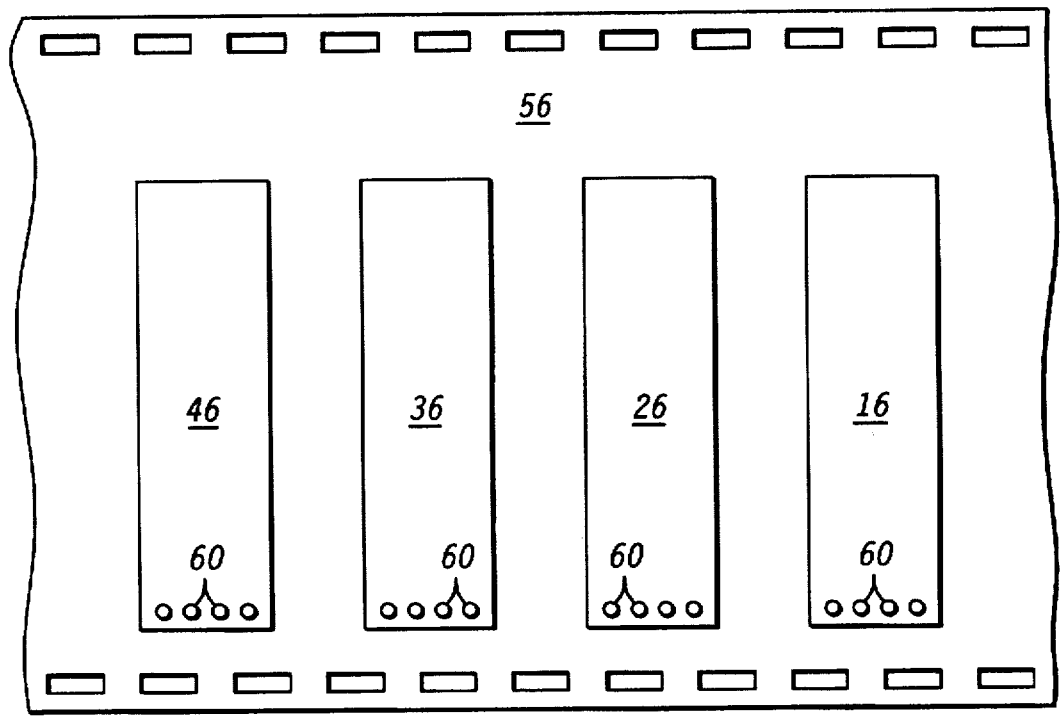
FIG. 4 illustrates the back side of the patterned flex tape shown in FIG. 3.

FIG. 4 illustrates the back side of patterned flex tape 56 shown in FIG. 3. The patterned copper foil interconnect lines from semiconductor die 18, 19, and 20 route to multiple pad connect sites 60 for providing interconnects between the flex boards and substrate 12. Flex tape 56 has a solder mask applied to flex boards 16, 26, 36, and 46 at multiple pad connect sites 60 for defining the attachment sites at which flexible appendages 15, 25, 35, and 45 attach to substrate 12. The connection sites for flip-chip attach on the flex boards are pads with an approximate length and width of one-hundred micrometers and a pad separation of about fifty to one hundred micrometers. The connecting pads on central substrate 12 align with the multiple pad connect sites 60 located on the end of each flexible appendage. Again, an adhesive system, such as thermoset isotropic adhesive dots could alternately be used to make electrical connection at these bonding sites.

In another embodiment for a folded module 10, substrate 12 also is fabricated from the same material as flex tape 56 (not shown). With the substrate as part of flex tape 56, the Z-axis adhesive or printed adhesive could be used for attaching appendages both physically and electrically. A printed conductor technology developed by Merix and commercialized through Alpha Metals called ABC could be used for this type of connection. The reel-to-reel flex tape 56 assembly which provides flex boards 16, 26, 36, 46 and substrate 12 results in pre-tested, lower profile, and lighter components. Components such as a memory device and a microprocessor on folded over flex boards provide for a cost-effective manufacturable package for semiconductor components.

Figure 5:
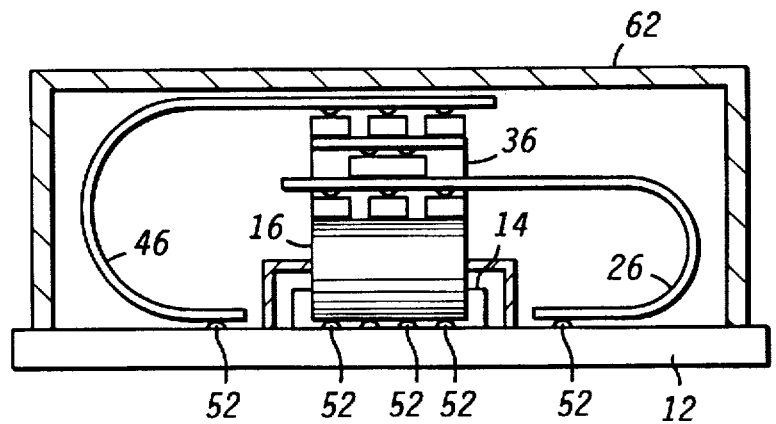
FIG. 5 illustrates a cross-sectional view of a three dimensional package with a protective cap in accordance with the embodiment shown in FIG. 1.

FIG. 5 illustrates a cross-sectional view of a three dimensional package with a protective cap 62 in accordance with the embodiment shown in FIG. 1. The entire assembly is electrically tested and a non-conductive insulating adhesive film (not shown) such as a polyimide film is applied to the backside of all of the attached die on flexible appendages 15, 25, 35, and 45 prior to initiating the folding process. The first flexible appendage is folded to reside over the first major surface of substrate 12. Thus, the first flexible appendage resides above microprocessor 14, but is insulated from microprocessor 14. Likewise, the second flexible appendage is folded to reside over the first flexible appendage, the third flexible appendage is folded to reside above the second flexible appendage, and the fourth flexible appendage is folded to reside above the third flexible appendage. The non-conductive contact adhesive film provides electrical isolation between folded layers of flexible appendages. Alternatively, a low flow nonconductive epoxy adhesive could be used for securing the folded flexible appendages above substrate 12. For those applications requiring enhanced thermal conductivity, an adhesive with improved thermal properties such as aluminum nitride or boron nitride filled is available. A protective cap 62 provides thermal heat transfer from the semiconductor devices to substrate 12, moisture protection for the semiconductor devices, and ElectroMagnetic Interference (EMI) ground shielding.

Figure 6:
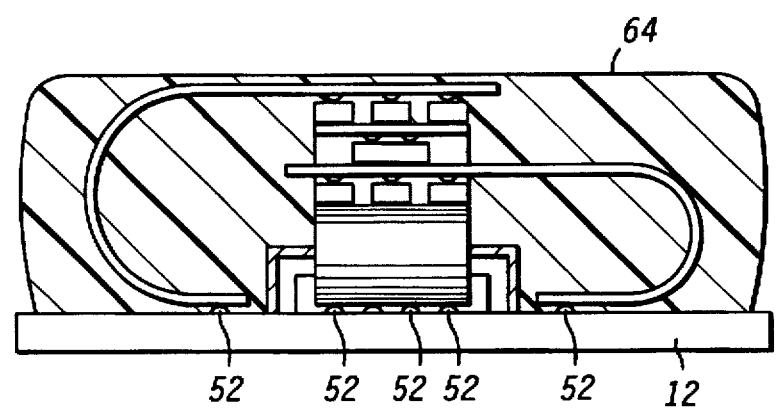
FIG. 6 illustrates a cross sectional view of another embodiment of a three dimensional package in accordance with the present invention.

FIG. 6 illustrates a three dimensional package with protective sealant 64 in accordance with the embodiment of FIG. 1. Protective sealant 64 is a glob top enclosure comprising an epoxy or silicone material and is used to encapsulate the entire assembly after all of the appendages have been folded. Vacuum is used to outgas all of the cavities of the package prior to the final cure of the encapsulant to ensure that the encapsulant has filled all of the recesses in the resultant package.

By now it should be appreciated that a three dimensional packaging approach reduces the overall footprint for interconnecting multiple semiconductor die. Folded module 10 produces a final package having a footprint size reduced by an approximate factor of four when compared to conventional electronic packaging. The module has a protective covering such as cap 62 or sealant 64 as a moisture barrier. Thus, high integration using flexible appendages 15, 25, 35, and 45 attached to rigid substrate 12 and singularly folded above substrate 12 results in both a small footprint package and also a light package. The reel-to-reel flex tape 56 assembly provides tested flex boards 16, 26, 36, and 46 resulting in a cost-effective manufacturable package for semiconductor components.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, another embodiment involves an alternative method for chip attachment to either a flex circuit or a rigid substrate. The die is attached face up using a commercially available silver filled epoxy die attach. Conductive die attach is available from Ablestik, Alpha Metals, and Hitachi Chemical. Electrical connection is achieved through wire bonds from the top side of the die to the flex circuit or substrate. Yet another embodiment uses die assembled in PGA array packages (not shown) and attached to the rigid substrate. Another embodiment attaches more than just the four flexible appendages attached to a first major surface of support substrate 12 by additional appendages being attached to a second major surface of support substrate 12 (not shown).

What is claimed is:

1. A semiconductor package, comprising;
   a support substrate;
   a first flexible appendage having a first end and a second end, wherein the first end is coupled to the support substrate and the first flexible appendage has a single fold after being folded over the support substrate; and
   a second flexible appendage having first and second ends, wherein the first end is coupled to the support substrate, the second end is isolated from the second end of the first flexible appendage, and the second flexible appendage has a single fold after being folded over the first flexible appendage.

2. The semiconductor package as claimed in claim 1, wherein a first semiconductor device is mounted to the support substrate.

3. The semiconductor package as claimed in claim 1, further comprising a thermal cap coupled to the support substrate.

4. The semiconductor package as claimed in claim 1, wherein the first ends of the first and second flexible appendages are coupled to adjacent sides of the support substrate.

5. The semiconductor package as claimed in claim 1, wherein the first ends of the first and second flexible appendages are coupled to opposite sides of the support substrate.

6. The semiconductor package as claimed in claim 1, wherein the support substrate and the first flexible appendage comprise different materials.

7. The semiconductor package as claimed in claim 1, further comprising a conductive connective structure that couples the first flexible appendage to the second flexible appendage via the support substrate.

8. The semiconductor package as claimed in claim 1, wherein the semiconductor package further comprises a glob top enclosure.

9. The semiconductor package as claimed in claim 1, wherein a first semiconductor device is attached to the first flexible appendage.

10. The semiconductor package as claimed in claim 2, wherein the first semiconductor device comprises a microprocessor.

11. The semiconductor package as claimed in claim 9, wherein the first semiconductor device comprises a memory device.

12. A semiconductor package, comprising:
    a substrate having a semiconductor die mounted on the substrate;
    a first flexible appendage having a first end coupled to a first side of the substrate and a second end that is folded over the semiconductor die; and
    a second flexible appendage having a first end coupled to a second side of the substrate adjacent to the first side.

13. The semiconductor package of claim 12, wherein the first flexible appendage further includes a single bend when folded over the semiconductor die.

14. The semiconductor package of claim 13, wherein the second flexible appendage further includes a second end that is folded over the first flexible appendage.

15. The semiconductor package of claim 14, wherein the second end of the first flexible appendage is isolated from the second end of the second flexible appendage.

* * * * *